(12) United States Patent
Dierickx (10) Patent No.: US 10,497,737 B2
(45) Date of Patent: Dec. 3, 2019

(54) ENHANCED DYNAMIC RANGE IMAGING

(71) Applicant: Caeleste CVBA, Antwerp (BE)

(72) Inventor: Bart Dierickx, Kontich (BE)

(73) Assignee: Caeleste CVBA, Antwerp (BE)

( * ) Notice: Subject to any disclaimer, the term of this patent is extended or adjusted under 35 U.S.C. 154(b) by 1224 days.

(21) Appl. No.: 13/905,569

(22) Filed: May 30, 2013

(65) Prior Publication Data

US 2014/0353472 A1    Dec. 4, 2014

(51) Int. Cl.
*H01L 27/146*    (2006.01)

(52) U.S. Cl.
CPC ............... *H01L 27/14643* (2013.01)

(58) Field of Classification Search
CPC ......... H01L 27/148; H01L 27/14806; H01L 27/14612; H01L 27/14643; H04N 5/3559
USPC ........ 250/208.1, 214.1, 214 R; 348/294–312
See application file for complete search history.

(56) References Cited

U.S. PATENT DOCUMENTS

| | | | |
|---|---|---|---|
| 3,551,761 A * | 12/1970 | Ruoff et al. | 257/443 |
| 7,821,560 B2 | 10/2010 | Suguawa et al. | |
| 8,227,844 B2 * | 7/2012 | Adkisson et al. | 257/292 |
| 2009/0144354 A1 * | 6/2009 | Misawa et al. | 708/838 |
| 2009/0284731 A1 * | 11/2009 | Jin | G01B 11/22 356/4.01 |
| 2013/0062604 A1 * | 3/2013 | Kautzsch | 257/48 |
| 2014/0284489 A1 * | 9/2014 | Engel | G01T 1/241 250/370.09 |

FOREIGN PATENT DOCUMENTS

EP    2 346 079 A1    7/2011

* cited by examiner

*Primary Examiner* — Georgia Y Epps
*Assistant Examiner* — Don J Williams
(74) *Attorney, Agent, or Firm* — Workman Nydegger (57) ABSTRACT

A pixel element for an imaging sensor comprises a semiconductor substrate, a radiation-sensitive element configured to generate electric charges in response to incident radiation, a charge accumulation region provided in the semiconductor substrate configured to accumulate at least a portion of the electric charges, and an electrode arranged on the semiconductor substrate adjacent to the charge accumulation region. The electrode is electrically insulated from the semiconductor substrate such as to form an inversion region in the semiconductor substrate that connects to the charge accumulation region when a voltage is applied to said electrode.

11 Claims, 6 Drawing Sheets

ENHANCED DYNAMIC RANGE IMAGING

FIELD OF THE INVENTION

The present invention relates to the field of image sensors. More specifically it relates to an imaging pixel element and image sensor with such imaging pixel elements.

BACKGROUND OF THE INVENTION

In many imaging applications, an image sensor needs to capture a high dynamic range (DR) of light intensities in an image. Classic image sensors have S/N ratio's (SNR) in the order of 1000:1 to 10000:1. When such sensor has a linear response, it can capture at most a dynamic range of a factor 10000:1 in light intensities. In order to increase the dynamic range of image sensors, many techniques are known in the art, which may use, for example, a non-linear response curve, e.g. multiple piece-wise linear slopes, logarithmic responses or log-lin responses, non-destructive readout, charge coupled devices (CCD) with two wells, overflow MOSFET capacitors, a combination of multiple shorter integration periods or smart reset pixels.

In European patent application EP 2346079, Wang et al. disclose a pixel structure comprising a photo-sensitive element, a first transfer gate connected between the photo-sensitive element and a first charge conversion element. A second transfer gate is connected between the photo-sensitive element and a second charge conversion element.

In U.S. Pat. No. 7,821,560, Sugawa et al. disclose a pixel structure comprising a photodiode, a transfer transistor coupled to the photodiode, and a plurality of capacitors for storing photocharges overflowing from the photodiode through the transfer transistor in storage operation. This "overflowing" implies a "storage gate" MOSFET between subsequent capacitance elements. In all drawings Sugawa shows capacitors separated by storage gates.

Figure 1:
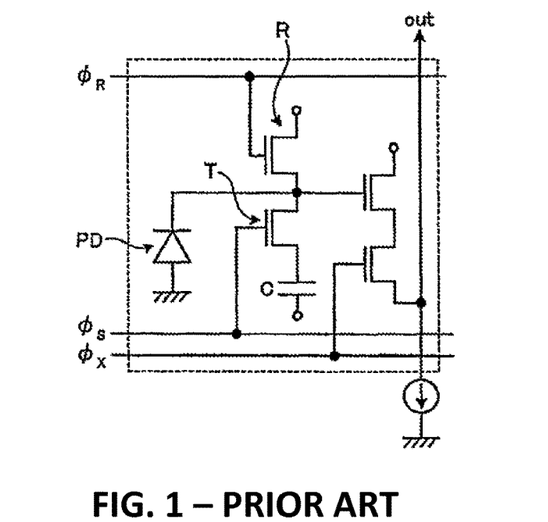
FIG. 1 illustrates a pixel element in accordance with a prior art technique.

FIG. 1 illustrates a pixel element in accordance with a prior art technique, also referred to in Sugawa et al., in which a transistor switch T is provided between a photodiode PD and a capacitance C. The switch T is turned on in a first exposure period to store photosignal charges in both the photodiode PD and the capacitance C and is turned off in a second exposure period to store photocharges in the photodiode PD in addition to the already stored charge in capacitance C, such that a wide dynamic range may be obtained.

SUMMARY OF THE INVENTION

It is an object of embodiments of the present invention to efficiently provide good imaging in an image sensor.

The above objective is accomplished by a method and device according to embodiments of the present invention.

Embodiments of the present invention relate to a pixel element, an image sensor having such pixel elements, and a method to operate such pixel element.

In a first aspect, the present invention provides a pixel element for an imaging sensor. The pixel element comprises a semiconductor substrate, a radiation-sensitive element configured to generate electric charges in response to incident radiation, a charge accumulation region provided in said semiconductor substrate configured to accumulate at least a portion of said electric charges, and an electrode arranged on the semiconductor substrate adjacent to the charge accumulation region, the electrode being electrically insulated from the semiconductor substrate such as to form an inversion region in the semiconductor substrate that connects to the charge accumulation region when a voltage is applied to said electrode.

A pixel element according to embodiments of the present invention may be connected to a controller for controlling connection and disconnection of the inversion region in the semiconductor substrate to and from the charge accumulation region, respectively, during a readout cycle of the pixel element. The controller may be dedicated to a single pixel and hence may form part of the pixel. However, typically such controller is too big to fit in the pixel and hence may be implemented as a controller common to a plurality of pixels, optionally a controller common to all pixels of an imaging device.

It is an advantage of embodiments of the present invention that a high dynamic range can be obtained by combining multiple sensitivity ranges, each sensitivity range being defined by the amount of charges that can be stored, which is a.o. dependent on the dimensions of the region formed by the charge accumulation region, optionally connected to the inversion region formed in the substrate when activating the electrode. It is a further advantage of embodiments of the present invention that the integration time of each sensitivity range is equal, thus that the high dynamic range may be obtained in just one precisely defined integration time, e.g. a predetermined integration time.

It is an advantage of embodiments of the present invention that a high semiconductor fill factor can be obtained. It is also an advantage of embodiments of the present invention that multiple sensitivity ranges can be obtained without complex switch arrangements and the associated control signal infrastructure.

In a pixel element according to embodiments of the present invention, the radiation-sensitive element may comprise a photodiode. Said photodiode may be a regular, hybrid or monolithic photodiode. The photodiode may be a pinned photodiode.

In embodiments of the present invention, the charge accumulation region may comprise a depletion region of the radiation-sensitive element.

In embodiments of the present invention, the charge accumulation region may comprise a floating diffusion region operably connected to the radiation-sensitive element via a transfer gate.

A pixel element according to embodiments of the present invention may comprise at least one further electrode, the at least one further electrode being electrically insulated from the semiconductor substrate such as to form at least one further inversion region in the semiconductor substrate. The inversion region and the at least one further inversion region are connected in series, in parallel or in a combination thereof to the charge accumulation region.

A pixel element according to embodiments of the present invention may further comprise a floating diffusion region operably connected to the charge accumulation region via a transfer gate. The pixel element may further comprise at least one yet further electrode, the at least one yet further electrode being electrically insulated from the semiconductor substrate such as to form at least one yet further inversion region in the semiconductor substrate. The at least one yet further inversion region is connected in series, in parallel or in a combination thereof to the floating diffusion region.

A pixel element according to embodiments of the present invention may further comprise an output stage configured to generate a signal representative of the amount of electrical charge stored in the charge accumulation region(s).

An aspect of the present invention provides an imaging sensor array comprising a plurality of pixel elements according to embodiments of the first aspect of the present invention.

In a further aspect, the present invention provides a method for reading out a pixel element. The method comprises storing electric charges generated in response to radiation incident on the pixel element in a charge accumulation region in a semiconductor substrate, applying a first voltage to an electrode to form an inversion region in the semiconductor substrate that connects to the charge accumulation region such that the electric charges are distributed over the charge accumulation region and the inversion region, obtaining a first electrical signal representative of the amount of electric charges, applying a second voltage to the electrode to reduce said inversion region, and obtaining a second electrical signal representative of the amount of electric charges.

In a method according to embodiments of the present invention, storing the electric charges in the charge accumulation region may comprise transferring the charges from a radiation-sensitive element to the charge accumulation region. Alternatively, storing the electric charges in the charge accumulation region may comprise accumulating the electric charges in a charge accumulation region of the radiation-sensitive element.

In embodiments of the present invention, applying the first voltage may comprise applying a voltage sufficient for forming an inversion region which has a charge storage capacity at least equal to the charge storage capacity of the charge accumulation region.

Obtaining the first electrical signal may comprise obtaining a first readout voltage potential over the charge accumulation region and obtaining the second electrical signal may comprise obtaining a second readout voltage potential over the charge accumulation region.

In a method according to embodiments of the present invention, applying the second voltage may comprise applying a second voltage which is smaller than the first voltage, such that at least a portion of the electric charges is pushed back into the charge accumulation region.

A method according to embodiments of the present invention may further comprise resetting the pixel element by draining away the electric charges from the charge accumulation region. The method may also comprise determining a first reference signal for characterizing the absence of the electrical charges generated by radiation incident on the pixel element while applying the first voltage to the electrode. Alternatively, the method may also comprise determining a second reference signal for characterizing the absence of the electrical charges generated by radiation incident on the pixel element while applying the second voltage to the electrode.

A method according to embodiments of the present invention may further comprise applying at least one further voltage to the electrode to reduce said inversion region yet further, and obtaining a third electrical signal representative of the amount of electric charges.

In a method according to embodiments of the present invention, applying a first voltage to an electrode to form an inversion region in the semiconductor substrate may comprise applying a first plurality of voltages to a plurality of electrodes to form a plurality of interconnected inversion regions in the semiconductor substrate that connect to the charge accumulation region such that the electric charges are distributed over the charge accumulation region and the interconnected inversion regions. Applying a second voltage to the electrode to reduce said inversion region may comprise applying a second plurality of voltages to a plurality of electrodes to reduce said interconnected inversion regions.

It is an advantage of embodiments of the present invention that high dynamic range photometry can be performed over a well-defined integration time, e.g. a predetermined integration time.

It is a further advantage of embodiments of the present invention that multiple sensitivity ranges may be obtained, each range having a substantially linear response. It is also an advantage that a gain factor may be implemented between each of these ranges, so that the ratio between the illumination level corresponding to saturation in the lowest gain range and the noise equivalent illumination level in the highest gain range, may correspond to a dynamic range that is much higher than each of the individual sensitivity ranges. While individual sensitivity ranges of 5000:1 may be provided, the combined sensitivity range can be in the order of 100000:1 or even more.

It is an advantage of embodiments of the present invention that a pixel element having a good dynamic range is provided.

It is an advantage of embodiments of the present invention that simultaneous measurements in multiple sensitivity ranges can be acquired efficiently in photometry.

It is an advantage of embodiments of the present invention that multiple sensitivity ranges can be combined to obtain a good dynamic range in photometry.

It is an advantage of embodiments of the present invention that multiple sensitivity ranges can be acquired while maintaining substantially equal integration times for each range.

It is an advantage of embodiments of the present invention that a dynamic range of more than a ratio of 5000:1, e.g. more than 10000:1, or even in the order of 100000:1 or more, in light intensities may be acquired in a single image frame.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Throughout this description, the terms "horizontal" and "vertical", "row" and "column" and related terminology are used to provide a coordinate system and for ease of explanation only. They do not need to, but may, refer to an actual physical direction of the device. Furthermore, the terms "column" and "row" are used to describe sets of array elements which are linked together. The linking can be in the form of a Cartesian array of rows and columns however the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, the claims refer to logically organized rows and columns. By this is meant that sets of array elements are linked together in a topologically linear intersecting manner; however, that the physical or topographical arrangement need not be so. For example, the rows may be circles and the columns radii of these circles and the circles and radii are described in this invention as "logically organized" rows and columns.

Furthermore, as will be evident to the person skilled in the art, where in relation to embodiments reference is made p-type and n-type, positive and negative charge carriers, free electrons and holes, or similar terms related to electric charge polarity, it will be understood that these may merely refer to respectively a first and a second electrical charge sign and, for example, the associated majority carrier behaviors of materials. Such terms may therefore equally refer to the opposite charge polarity, insofar such charge sign reversal is consistently applied to the related structures.

In a first aspect, the present invention relates to a pixel element for an imaging sensor. The pixel element comprises a semiconductor substrate and a radiation-sensitive element for generating electric charges in response to incident radiation, e.g. the radiation-sensitive element is configured to generate electric charge in response to incident radiation. The pixel element further comprises a charge accumulation region provided in the semiconductor substrate, whereby this charge accumulation region is configured to accumulate at least a portion of the generated electric charges. The pixel element further comprises an electrode arranged on the semiconductor substrate adjacent to the charge accumulation region. The electrode is electrically insulated from the semiconductor substrate such as to form an inversion region in the semiconductor substrate that connects to the charge accumulation region when a voltage is applied to said electrode, e.g. such that charge storage in the charge accumulation region can be extended over the inversion region when a voltage is applied to the electrode. The electrode may thus be adapted for enabling a transfer of electric charge from the charge accumulation region to the inversion region when a suitable voltage is applied to the electrode. The insulated electrode and the inversion region in the semiconductor substrate may form a conductor-insulator-semiconductor capacitive element, e.g. a metal-insulator-semiconductor (MIS) or metal-oxide-semiconductor (MOS) capacitor.

A plurality of pixel elements according to embodiments of the present invention may be provided in an imaging sensor to obtain signals representative of a spatial distribution of a radiative quality over the imaging sensor. While each pixel element may be adapted to provide a local measure of a light quality, e.g. a light intensity, the present invention is not limited to photographic imaging or video recording in the visual light spectrum, but may also relate to imaging in the infrared, ultraviolet, X-ray or gamma range of the light spectrum, or even to detection of spatial distribution of other types of radiation, e.g. particle radiation, such as electron waves or proton waves. A plurality of pixel elements may be arranged in an array in an imaging sensor. For example, the pixel elements may be logically organized in rows and columns in an imaging sensor.

Figure 2:
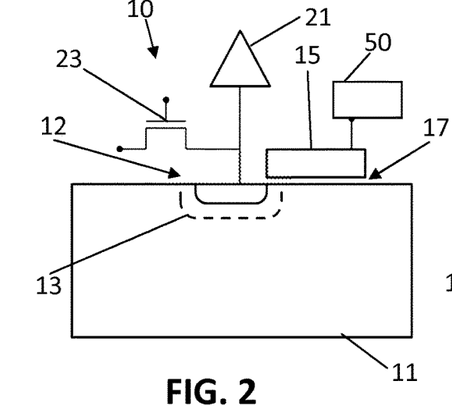
FIG. 2 shows a pixel element for an imaging sensor according to a first embodiment of the present invention in a first state.

Referring to FIG. 2, a pixel element 10 for an imaging sensor according to a first embodiment of the present invention is shown. The pixel element 10 comprises a semiconductor substrate 1. The semiconductor substrate may be a p-type substrate, e.g. may be composed of silicon or germanium with a small amount of p-type dopants such as boron, aluminum or other group III elements to provide an excess of holes in the substrate.

The pixel element 10 comprises a radiation-sensitive element 12 for generating an electric charge in response to incident radiation, and a charge accumulation region 13 is provided in the semiconductor substrate 1 for accumulating this electric charge. For example, the charge accumulation region 13 may be formed by an n-doped region embedded in the p-type substrate 1.

The radiation-sensitive element 12 may comprise a photodiode, e.g. a regular photodiode, a hybrid photodiode or a monolithic photodiode. The radiation-sensitive element 12 may be a pinned photodiode (PPD). Alternatively, the photosensitive element 12 may for example comprise a metal-insulator-semiconductor structure forming a photogate. However, the present invention is not limited thereto, as it also applies to other radiation-sensitive elements 12, e.g. photoreceptors or radiation receptors that produce a current as function of the detected radiation, such as APDs, bolometers or photoresistors.

The charge accumulation region 13 may be formed by a depletion layer of the radiation-sensitive element 12, e.g. a depletion layer of a photodiode or photogate, e.g. a layer formed between doped semiconductor regions having opposite doping polarity forming such photodiode. However, as will be described further below in further detail, the charge accumulation region 13 may be separate from the radiation-sensitive element 12 and may collect charges generated in the radiation-sensitive element and transmitted through a conductive path between the radiation-sensitive element 12 and the charge accumulation region 13, e.g. the charge accumulation region may be floating diffusion region provided in the substrate.

Figure 3:
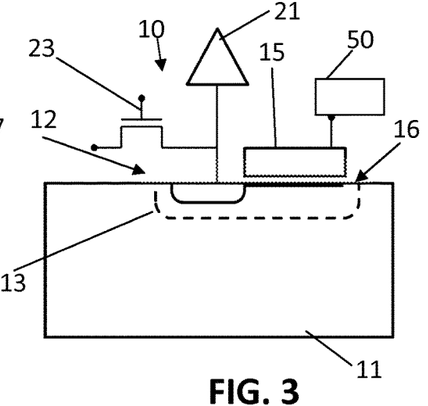
FIG. 3 shows the pixel element for an imaging sensor according to a first embodiment of the present invention in a second state.

The pixel element further comprises an electrode 15 arranged on the semiconductor substrate adjacent to the charge accumulation region. The electrode 15 is electrically insulated 17 from the semiconductor substrate such as to form an inversion region in the semiconductor substrate that connects to the charge accumulation region when a voltage is applied to said electrode, e.g. such that charge storage in the charge accumulation region can be extended over the inversion region when a voltage is applied to the electrode. For example, the electrode 15 may be isolated from the semiconductor substrate 11 by an electrically insulating material, e.g. a material having high electric susceptibility, e.g. a semiconductor oxide such as silicon dioxide. The inversion region 16 may be adapted for enabling a transfer of electric charge from the charge accumulation region 13 to the inversion region 16 when a suitable voltage is applied to the electrode 15. For example, FIG. 2 shows the charge accumulation region 13, e.g. a volume in the semiconductor material where charges are stored formed by a n-type region in a p-type semiconductor substrate, while the electrode 15 is inactive, e.g. switched to a suitable potential such as for example ground potential, while FIG. 3 shows an extended volume in the semiconductor material for storing these charges, comprising the inversion region 16 adjoining the charge accumulation region 13. This charge capacity extension is enabled by applying a suitable potential to the electrode 15, such that the electrode 15 and the inversion region 16 may form a capacitive element, e.g. a conductor-insulator-semiconductor capacitive element. For example, the electrode may be arranged on the substrate in close proximity to the charge accumulation region 13 such that this inversion region 16 allows charge migration between the charge accumulation region 13 and the inversion region 16. Thus, the electrode 15 and the inversion region 16 in the semiconductor substrate 11 may form a tunable capacitive element, e.g. a metal-insulator-semiconductor (MIS) capacitor, adapted for extending the charge storage capacity in a controllable manner, e.g. by adjusting the voltage applied to the electrode 15. In particular embodiments, the charge storage capacity of such tunable capacitive element may be larger than the capacity of the charge accumulation region 13.

For controlling the activation and/or inactivation of the electrode 15, hence the switching on and switching off or thus connection and disconnection between the inversion region 16 in the substrate to the charge accumulation region 13, a suitable controller 50 may be provided, suitably programmed for applying the right potential, e.g. voltage signals, to the electrode 15. Such connection and disconnection are preferably both performed during a readout cycle of the pixel element 10.

The pixel element 10 may also comprise an output stage 21 configured to generate a signal representative of the amount of electrical charge stored in the charge accumulation region 13. For example, the charge accumulation region 13, e.g. a floating diffusion region connected to the photosensitive element 12 or a depletion layer of the photosensitive element 12, may be connected to the gate of an output buffer amplifier, e.g. a charge to voltage amplifier such as a source follower. Before readout of the pixel element 10, the charge accumulation region 13 may be reset, i.e. emptied of non-equilibrium charge carriers, for example by operating a reset switch 23 which opens a conductive path from the charge accumulation region 13 to a reference voltage supply. During an integration period, the voltage in the charge accumulation region 13 may change due to charge accumulation, and this change may be amplified by the output buffer amplifier for readout.

Figure 4:
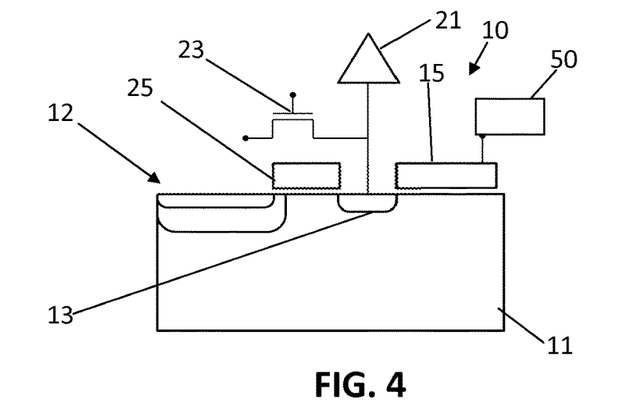
FIG. 4 shows a pixel element according to an embodiment of the present invention in which the charge storage region comprises a floating diffusion region.

Referring to FIG. 4, in an embodiment according to the present invention the charge storage region 13 may comprise a floating diffusion region, which may also be referred to as a "sense node", formed in or on the semiconductor substrate 11. Such floating diffusion region may store charge for readout in the pixel element. The floating diffusion region may be a region in active silicon electrically isolated from all other nodes, for example it may be a quasi-neutral region, e.g. which is not fully depleted, isolated by p-n junction from other nodes. Typically, there are no metal contacts to such region. Thus, its potential may be determined by the amount of charge stored in it, and its capacitance. The capacitance of this region is preferably very low, to achieve a high conversion gain, e.g. to achieve a large change of its voltage with the addition of one electron. Such region is referred to as a floating diffusion region because, on the one hand, this region may be located in Si diffusion, and on the other hand, the region is not connected to any of the fixed or controlled voltage nodes such that its potential may be considered to be "floating", i.e. its potential level will vary depending on the amount of charge present on the node. Before readout, the floating diffusion region may be emptied of non-equilibrium charge carriers, i.e. may be reset. During the readout, the charges generated in the photo-sensitive element 12, e.g. stored in a pinned photodiode, may be transferred to the floating diffusion region, e.g. by opening a transfer gate 25.

Figure 5:
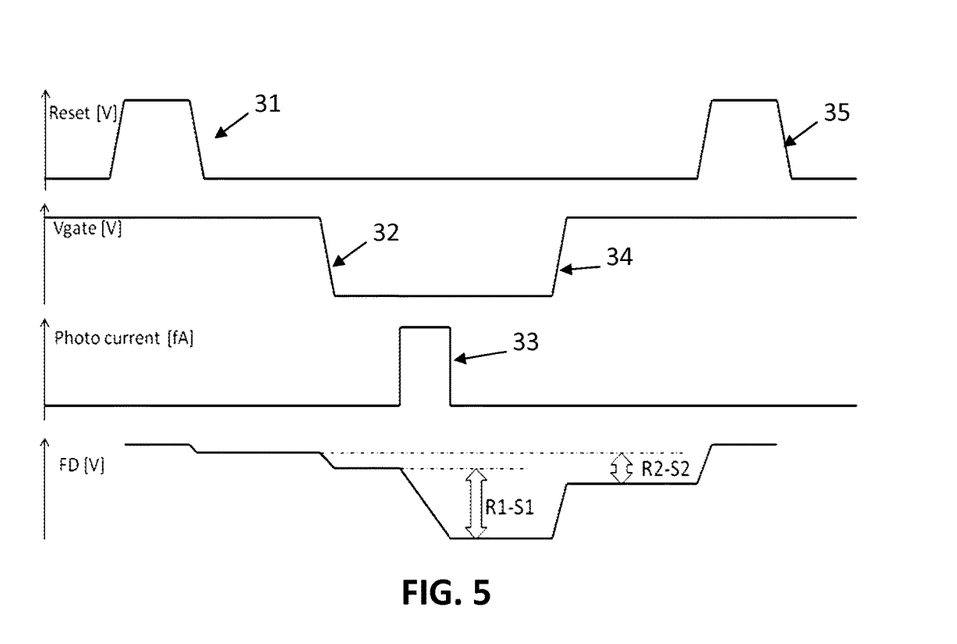
FIG. 5 shows an exemplary temporal sequence of operation of a pixel element according to embodiments of the present invention.

An exemplary temporal sequence of operation of a pixel element according to embodiments of the present invention is illustrated in FIG. 5. First, a reset signal 31 may be generated to clear the system from residual charges. When the switchable capacitive element is switched off by applying a suitable voltage to electrode 15, represented by the low voltage level transition 32, the pixel is set in a high sensitivity mode. When a photocurrent 33 is subsequently generated, e.g. by exposing the radiation-sensitive element 12, for example by opening a shutter during an exposure interval, a voltage drop on the floating diffusion R1-S1 may be observed. This voltage is substantially determined by the capacitance of the floating diffusion region and the amount of accumulated charge. When subsequently the switchable capacitive element is switched on by applying a suitable voltage signal to electrode 15, represented by the high voltage level transition 34, the pixel is set in a low sensitivity mode. Now, a voltage drop on the floating diffusion R2-S2 may be observed which is generally smaller than the earlier observed voltage drop R1-S1. The smaller voltage drop, which thus corresponds to a lower sensitivity, is substantially determined by the amount of accumulated charge and the parallel capacitance of the floating diffusion region and inversion region induced by the electrode. Thus the photocharge corresponding to the same exposure interval may be efficiently characterized by signals corresponding to two dynamic range intervals, e.g. for two gain settings. After readout, the pixel element may be reset 35 again to prepare the element for a further readout cycle. As will be evident to the person skilled in the art, in each sensitivity range, correlated double sampling (CDS) may be applied, e.g. corresponding to R1-S1 and R2-S2, however, this is not required. For example, CDS can be applied to the high sensitivity readout R1-S1, while for the low sensitivity range a raw readout may be sufficient.

Figure 6:
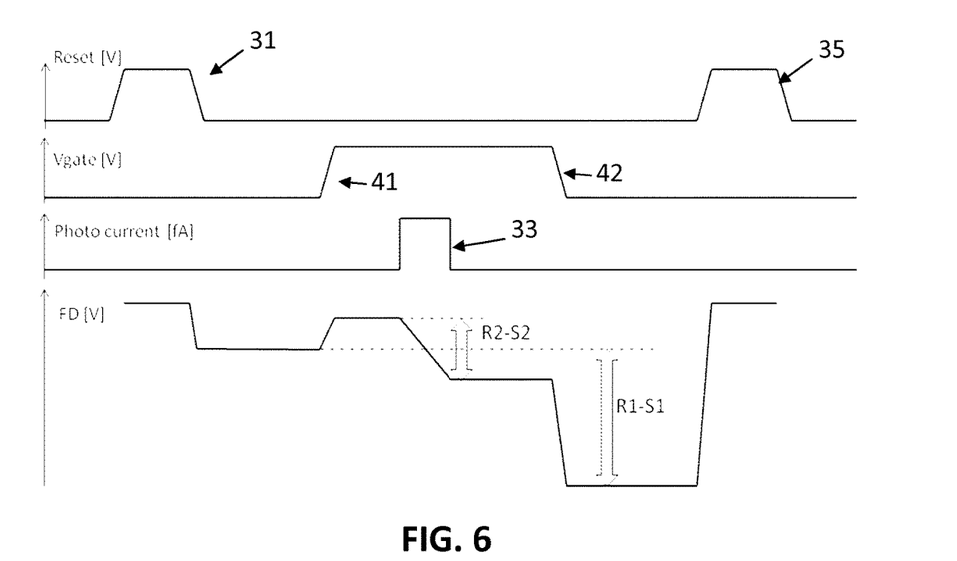
FIG. 6 shows an alternative temporal sequence of operation of a pixel element according to embodiments of the present invention.

An alternative temporal sequence of operation of a pixel element according to embodiments of the present invention is illustrated in FIG. 6. First, a reset signal 31 may be generated to clear the system from residual charges. Here, the switchable capacitive element is first switched on by applying a suitable voltage to the electrode 15, represented by the high voltage level transition 41. The pixel is thus set in a low sensitivity mode. When the photocurrent 33 is subsequently generated during an exposure interval, a voltage drop on the floating diffusion R2-S2 may be observed corresponding to a low gain, i.e. a low sensitivity and large dynamic range. When subsequently the switchable capacitive element is switched off by applying a suitable voltage to electrode 15, represented by the voltage level transition 42, the pixel is set in a high sensitivity mode. It is noted that, unlike in prior art pixel elements comprising an auxiliary capacitor connected via a switch to the charge accumulation region, in embodiments according to the present invention substantially the total amount of charge is returned to the charge accumulation region. Now, a voltage drop on the floating diffusion R1-S1 may be observed which corresponds to a higher sensitivity. Thus, while both sensitivity measurements are obtained for charges generated during the same exposure interval, as in the operational scheme shown in FIG. 5, here the photocharge is generated at the moment of lowest sensitivity. Where in the scheme shown in FIG. 5 charge which exceeds the charge handling capability of the charge accumulation region may be lost, this is avoided in the present mode of operation, up to the limit of the combined charge handling capability of the charge accumulation region and the switchable capacitive element formed by the electrode 15. However, the combined dynamic range of both sensitivity levels is maintained.

Figure 7:
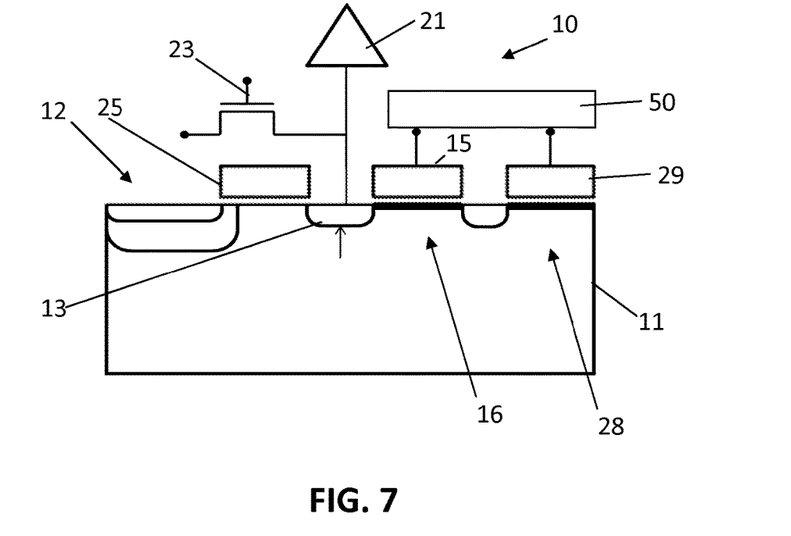
FIG. 7 shows a pixel element according to embodiments of the present invention which comprises at least one further electrode.

Embodiments of the present invention may furthermore comprise at least one further electrode 29, as shown in FIG. 7. The at least one further electrode 29 is electrically insulated from the semiconductor substrate such as to form a further inversion region in the semiconductor substrate that connects to the charge accumulation region 13 or to the inversion region generated by another electrode when a voltage is applied to the at least one further electrode 29. Thus, multiple tunable capacitive elements may be provided having controllable inversion regions in the semiconductor material which are connected in series, in parallel or in a combination thereof, to the charge accumulation region 13.

For example, as shown in FIG. 7, a pixel element may comprise a transfer gate 25 and two tunable or switchable capacitors in series to the floating diffusion, respectively controlled by the electrode 15 and the further electrode 29. For controlling the activation and/or inactivation of the electrodes 15 and 29, hence the switching on and switching off or thus connection and disconnection between the inversion regions in the substrate to the charge accumulation region 13, a suitable controller 50 may be provided, suitably programmed for applying the right potentials, e.g. voltage signals, to the electrodes 15 and 29. Such connection and disconnection are preferably both performed during a readout cycle of the pixel element 10. The controller 50 may be a single controller controlling the activation of both electrodes 15 and 29, as illustrated in FIG. 7, or may be separate controllers (not illustrated) for both electrodes 15, 29. A controller may be provided dedicated for controlling one or more electrodes of a pixel, or for controlling electrodes of a plurality of pixels, optionally all pixels of an imager comprising the pixels.

Figure 8:
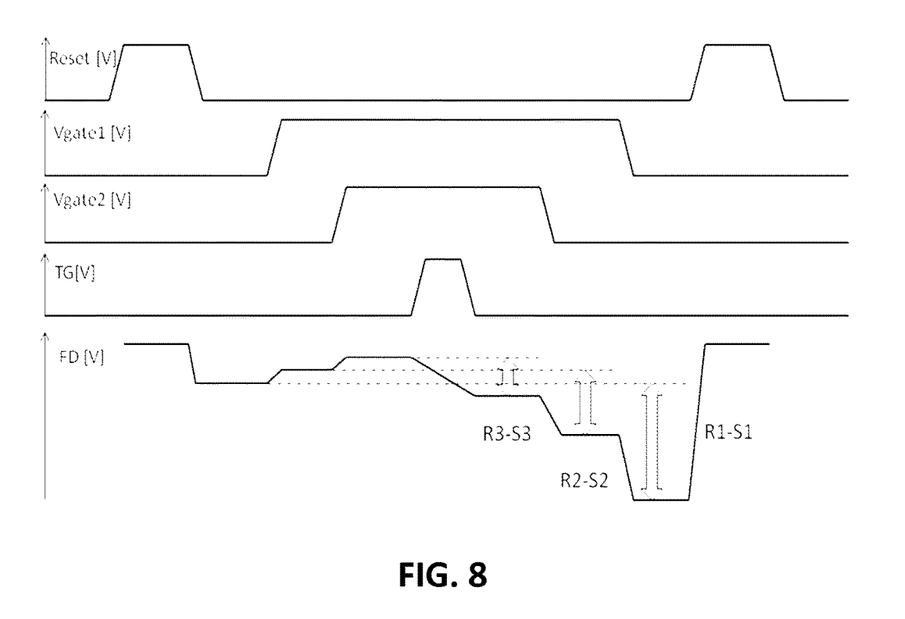
FIG. 8 shows an exemplary readout scheme for a pixel element according to embodiments of the present invention which comprises at least one further electrode.

When initially both switchable capacitors are active, by application of suitable voltages to the electrodes 15, 29, the sensitivity is lowest, e.g. corresponding to the lowest charge to voltage ratio, and the charge is distributed over the charge accumulation region 13, e.g. the floating diffusion region, the inversion region 16 corresponding to the electrode 15 and the further inversion region 28 corresponding to the further electrode 29. When subsequently the switchable capacitor driven by the further electrode 29 is switched off, the charges are redistributed over the charge accumulation region 13 and the inversion region 16, thus providing a medium sensitivity range. Then, when the switchable capacitor drive by electrode 15 is also switched off, the charges will be pushed back to charge accumulation region 13, which corresponds to the highest sensitivity range for readout. The exemplary readout scheme for this sequential deactivation is shown in FIG. 8, where Reset corresponds to the control signal of the reset means 23, TG to the control signal for the transfer gate 25, Vgate1 to the control signal of the electrode 15 and Vgate2 to the control signal of the further electrode 29.

Figure 9:
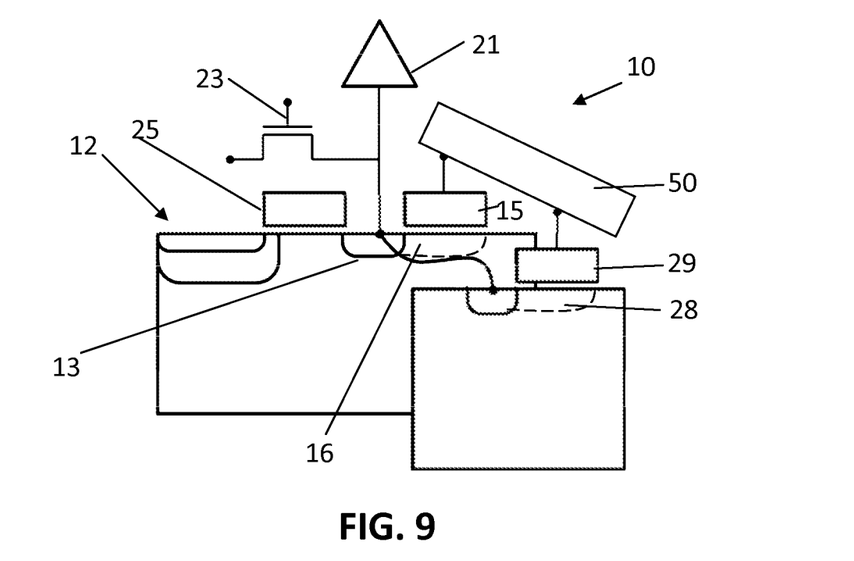
FIG. 9 shows a pixel element according to embodiments of the present invention which illustrates an inversion region and one further inversion region in parallel connected to a floating diffusion region.

As will be evident to the person skilled in the art, the charge accumulation region 13, the inversion region corresponding to the electrode 15 and the or any further inversion region corresponding to the or any further electrode 29 need not be connected in series. As schematically illustrated in FIG. 9, in embodiments according to the present invention, these elements may equally well be arranged in parallel, or in a combination of pairwise connections in parallel and in series. The example shown in FIG. 9 shows the inversion region 16 associated with electrode 15 and one further inversion region 28 associated with further electrode 29 in parallel, both connected to the charge accumulation region 13, e.g. a floating diffusion region.

Figure 10:
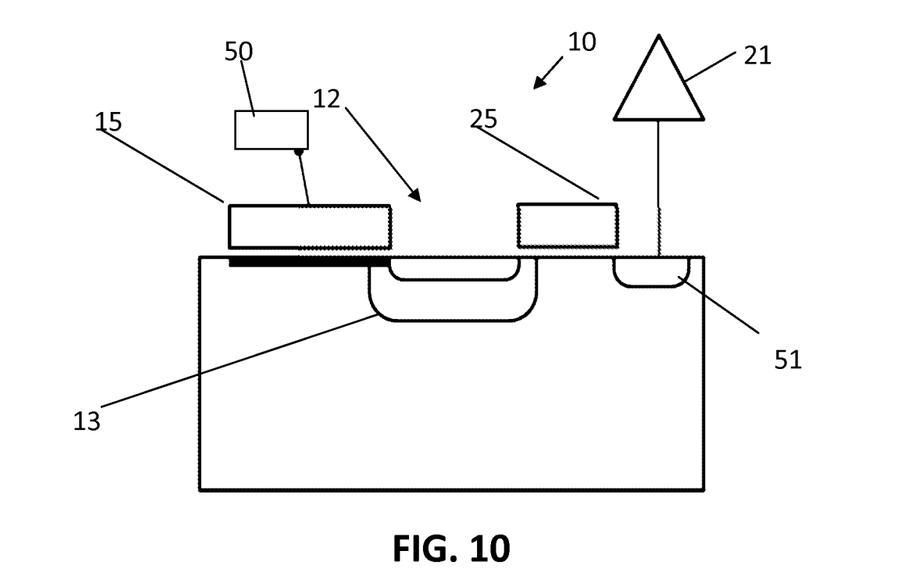
FIG. 10 shows a pixel element according to embodiments of the present invention in which the charge accumulation region corresponds to a storage region inherent to the radiation-sensitive element and further comprising a floating diffusion region.

Furthermore, in a pixel element according to embodiments of the present invention, the charge accumulation region 13 may form part of the radiation-sensitive element 12, e.g. of a pinned photodiode. Such radiation-sensitive element 12, e.g. atypical pinned photodiode, may have a low inherent charge handling capability, for example substantially less than the typical charge storage capability of a MOS capacitor. When the charge is transferred for readout to floating diffusion region, the capacity of this charge accumulation region 13 inherent to the radiation-sensitive element 12 may be insufficient. Therefore, it may be advantageous to have a means to increase the charge handling of the charge accumulation region 13, e.g. in the pinned photodiode, as provided by embodiments of the present invention. Referring to FIG. 10, a pixel element is shown in which the charge accumulation region 13 corresponds to a storage region inherent to the radiation-sensitive element 12. While a floating diffusion region 51 is provided, connected via transfer gate 25 to the radiation-sensitive element 12, in which the floating diffusion region 51 may be readout through the output stage 21, an electrode 15 is here provided adjacent to the radiation-sensitive element 12 in order to selectively extend the capacity of the charge storage region 13. Such pixel element may advantageously operate in a "conventional" mode of operation, in which the electrode is switched off. In this setting the mode of operation of the pixel element will substantially be equal to a conventional pixel element without the provision of the electrode 15. However, when a lower sensitivity is required, the charge handling capability may be extended by suitably biasing the electrode 15, e.g. by biasing it positively. In order to empty the inversion region under the electrode 15 from charges, the electrode 15 may be returned to low voltage during the transfer of charges to the floating diffusion 51.

Figure 11:
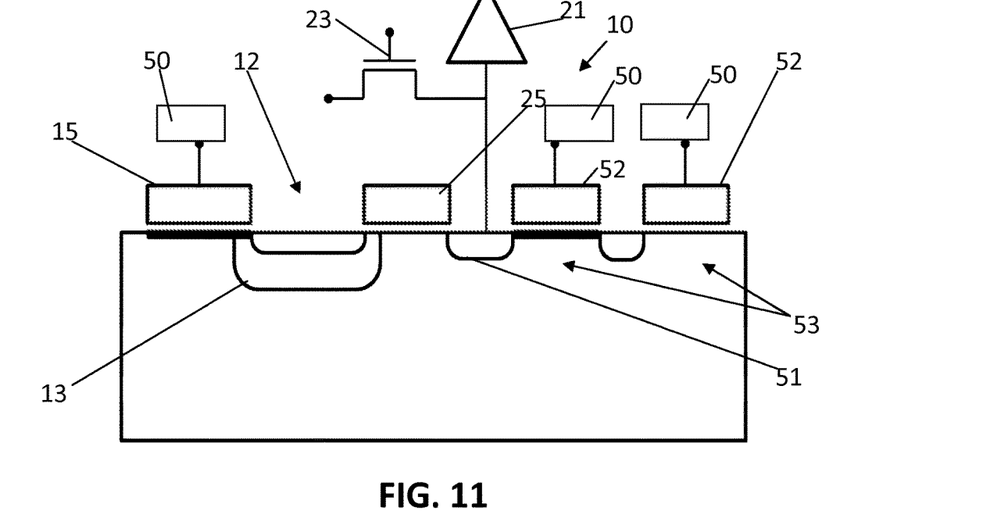
FIG. 11 shows a pixel element according to embodiments of the present invention in which the charge accumulation region corresponds to a storage region inherent to the radiation-sensitive element and further comprising a floating diffusion region and at least one yet further electrode.

Referring to FIG. 11, a further exemplary embodiment according to the present invention is shown. In addition to the features described hereabove in relation to FIG. 10, at least one yet further electrode 52 may be provided, e.g. two further electrodes, which is electrically insulated from the semiconductor substrate such as to form at least one yet further inversion region 53 in the semiconductor substrate. The at least one yet further inversion region 53 may be connected in series, in parallel or in a combination thereof to the floating diffusion region 51. Thus, a combination may be formed of a tunable capacitive or multiple tunable capacitive elements on the radiation-sensitive element and a tunable capacitive or multiple tunable capacitive elements on the floating diffusion region.

In this embodiment, instead of a single controller for activating the electrodes 15, 52, a plurality of controllers 50 are illustrated.

Figure 12:
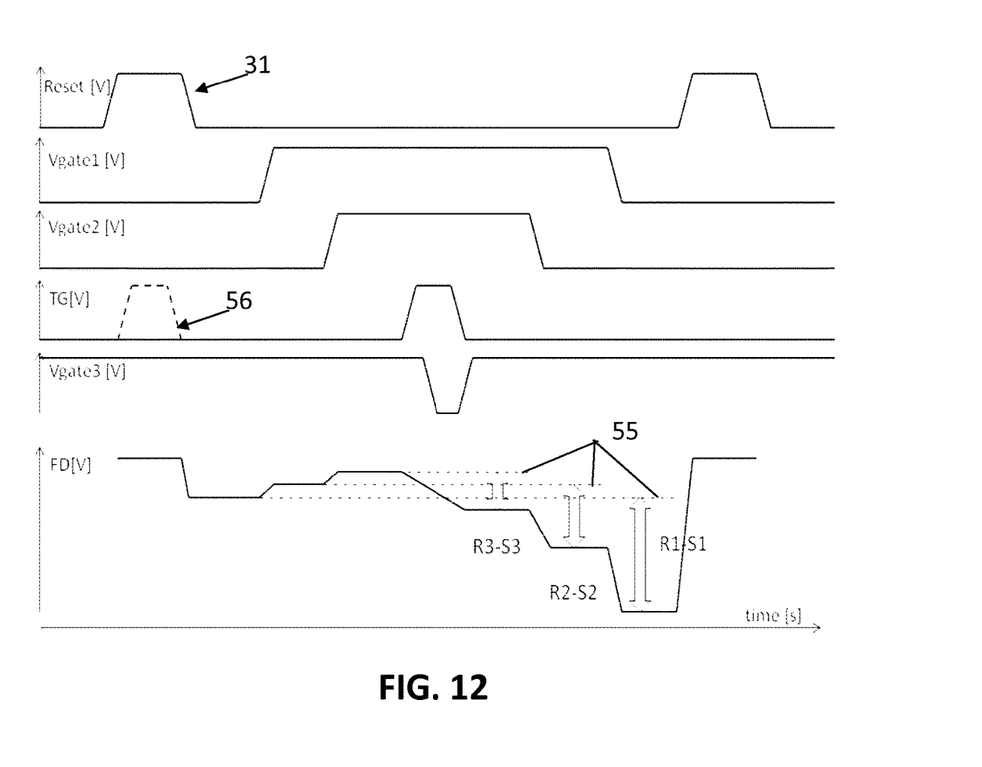
FIG. 12 shows an exemplary temporal sequence of operation of a pixel element according to embodiments of the present invention such as depicted in FIG. 11.

An exemplary temporal sequence of operation of a pixel element according to embodiments of the present invention such as depicted in FIG. 11 is illustrated in FIG. 12. First, a reset signal 31 may be generated to clear the floating diffusion region from residual charges. Furthermore, an optional pulse 56 on the transfer gate may be provided during reset, such that charges in the charge accumulation region of the radiation-sensitive element are cleared as well, e.g. to implement an electronic shutter. The yet further switchable capacitive elements, driven by yet further electrodes connected in series to the floating diffusion may be initially switched off, represented by the low voltage levels of Vgate1 and Vgate2, while the switchable capacitive element driven by the electrode connected to the charge accumulation region 13 provided by the radiation-sensitive element 13 may be switched on, represented by the high voltage level of Vgate3. As such, during the exposure interval, the photosensitive element is switched in an extended dynamic range state. Then, for example, Vgate1 and Vgate2 may be switched on to prepare for a readout in the highest dynamic range setting on the output stage connected to the floating diffusion region. Furthermore, this activation of Vgate1 and Vgate2 may be performed in sequence, such that reference voltage levels 55 may be determined, e.g. for CDS, as indicated in the output signal trace FD. During the readout phase, charges are transferred from the charge accumulation region of the radiation-sensitive element to the floating diffusion by activating the transfer gate TG. The charges which are dispersed over the inversion region provided by the electrode 15 may be efficiently pushed to the floating diffusion by also switching the voltage Vgate3 on the electrode 15 to a low state. Multiple signals R3-S3, R2-S2, R1-S1 may then be obtained corresponding to a low, medium and high sensitivity range by switching the yet further electrodes in sequence, e.g. as previously described in relation to FIG. 8.

A device according to embodiments of the present invention may be used in applications where an image sensor needs to capture a high dynamic range (DR) of light intensities within an acquired image. In order to achieve a good dynamic range, a pixel element is provided by embodiments of the present invention that may have multiple linear ranges, e.g. each with a realistic dynamic range, e.g. 5000:1. Furthermore, a gain factor may be implemented between these ranges, e.g. between every pair selected from these ranges, so that the ratio between the illumination level corresponding to saturation in the lowest gain range and the noise equivalent illumination level in the highest gain range, represents a DR that is higher than 5000:1, for example in the order of 10000:1, or in the order of 100000:1, or even higher. This gain factor between ranges may be obtained by a tunable capacitive element, e.g. a programmable MOS capacitor, that is placed in parallel to the floating diffusion and/or in parallel to the photodiode. This tunable capacitive element may be controlled, for example, by first collecting all photo charges in the large valued capacitor, and then reducing the capacitance value by changing the MOS gate voltage.

Comparing a pixel element according to embodiments of the present invention, e.g. as illustrated in FIGS. 2 and 3, to a pixel element known in the art, as depicted in FIG. 1, it will be seen that both arrangements may provide an extended dynamic range by migrating charges from a charge accumulation region, i.e. the photodiode PD output, to a capacitive element, i.e. capacitor C. However, embodiments of the present invention can provide a simpler design, and thus may provide efficient area utilization of the substrate and low production costs. Furthermore, embodiments of the present invention enable a substantially complete charge transfer back to the charge accumulation region 13 by switching off the voltage supply to the electrode 15, unlike the effect of deactivating the gate T in the pixel element known in the art shown in FIG. 1.

Figure 13:
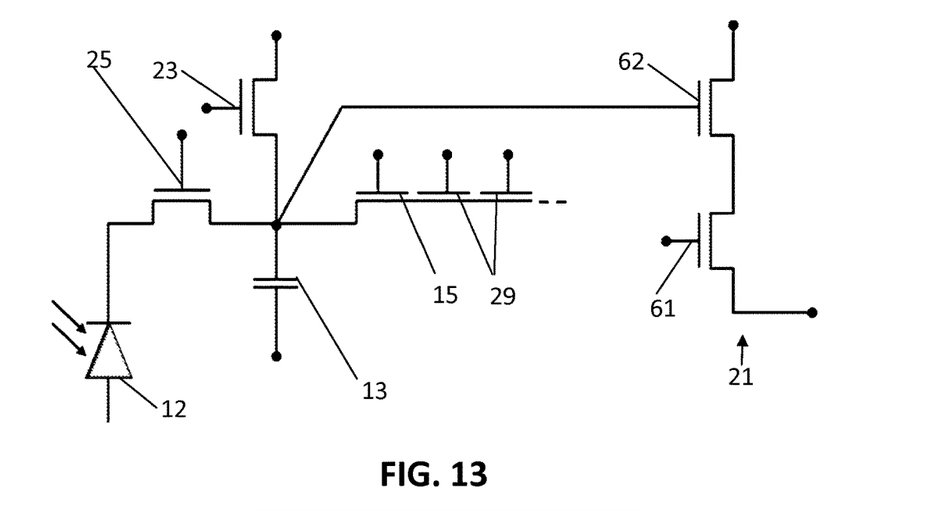
FIG. 13 shows a circuit representation of another exemplary embodiment of the present invention.

A circuit representation of another exemplary embodiment of a pixel according to embodiments of the present invention is shown in FIG. 13. Here, a photodiode 12 is connected via transfer gate 25 to the charge accumulation region 13. The charge accumulation is connected through a reset switch 23 to the voltage supply Vdd for clearing charges from the charge accumulation region 13. The charge accumulation region 13 is further connected to the output stage 21, which may comprise, for example, a source follower 62 and a selection line 61 for routing the output signal to further processing means, e.g. processing means implemented in the imaging sensor in which the pixel element is incorporated. Here, the electrode 15 and the at least one further electrode 29 are represented as a 3 gate CCD, which may be implemented as an actual CCD, or, for example, may comprise a plurality of MOS gates which are separated by small gaps.

In a second aspect, the present invention also relates to an imaging sensor array comprising a plurality of pixel elements according to the first aspect of the present invention. As will be apparent to the skilled person, this plurality of pixel elements may be arranged in physical or logical rows and columns and may be interconnected by signal lines, e.g. row selection lines and/or reset signal lines, as is known in the art. Such imaging sensor array may further comprise a control unit and/or a processing unit, e.g. a controller and/or processor, for applying a sequence of control signals to the signal lines, performing pixel readout, e.g. analog to digital conversions of readout voltage levels, and outputting or storing a representation of an image acquired by combining the pixel readout signals of the plurality of pixel elements.

Figure 14:
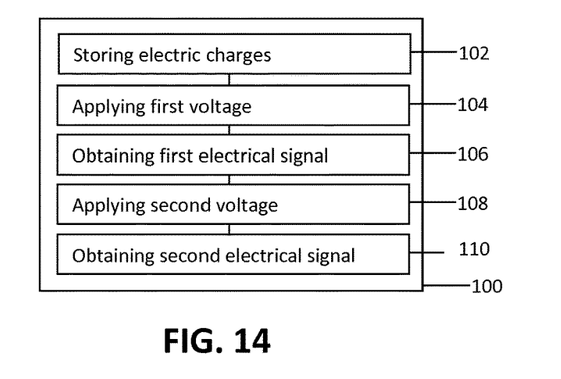
FIG. 14 illustrates an exemplary method according to embodiments of the present invention.

In a third aspect, the present invention relates to a method for reading out a pixel element, e.g. a pixel element according to the first aspect of the present invention. FIG. 14 shows such an exemplary method 100 according to embodiments of the present invention. The method 100 comprises storing 102 electric charges generated by radiation incident on the pixel element in a charge accumulation region in a semiconductor substrate. Storing 102 electric charges in the charge accumulation region may comprise transferring the charges from a radiation-sensitive element to the charge accumulation region, e.g. to a floating diffusion region. However, storing 102 the electric charges may also comprise accumulating the electric charges, e.g. integrating the charges in a charge accumulation region of the radiation-sensitive element.

The method also comprises applying 104 a first voltage to an electrode to form an inversion region in the semiconductor substrate that connects to the charge accumulation region such that the electric charges are distributed over the charge accumulation region and the inversion region. Applying 104 a first voltage may comprise applying a voltage sufficient for forming an inversion region which has a charge storage capacity at least equal to the charge storage capacity of the charge accumulation region, and preferably a charge storage capacity larger than the charge storage capacity of the charge accumulation region, e.g. at least twice as large, or at least five times as large. For example, the electrode and inversion region may form a tunable capacitance having a capacitance at least equal to the capacitance of the charge storage region.

The method 100 further comprises obtaining 106 a first electrical signal representative of the amount of electric charges, e.g. a first readout voltage potential over the charge accumulation region.

The method further comprises applying 108 a second voltage to the electrode to reduce said inversion region, for example applying a second voltage which is smaller than the first voltage, e.g. applying a zero voltage, such that at least a portion of the electric charges is pushed back into the charge accumulation region, and obtaining 110 a second electrical signal representative of the amount of electric charges, e.g. a second readout voltage potential over the charge accumulation region. Applying 108 the second voltage may comprise applying a voltage sufficient for reducing the inversion region such that the inversion has a charge storage capacity which is substantially less than the charge storage capacity when the first voltage was applied, e.g. which is less than 50% of the original charge storage capacity when the first voltage was applied, or even applying a voltage sufficient for removing the inversion region, such that the charge storage capacity of the inversion region is reduced substantially to zero, e.g. such that only an inherent passive charge storage capacity can remain. Reducing the inversion region may equally refer to causing a decrease in volume in the semiconductor substrate where the charges can be stored, and/or to reducing the charge storage capacity of the inversion region, and/or to reducing the capacitance of the capacitive element formed by the electrode and the charge inversion region.

For example obtaining 106,110 a first and second electrical signal representative of the amount of electric charges may comprise obtaining a first and second readout voltage potential over the charge accumulation region, the first and second readout voltage potential being determined by substantially the same amount of electrical charge, generated by the incident radiation on the pixel element, and a respectively first and second capacitance. The first and second voltage levels applied 104, 108, which affect this first and second capacitance, can therefore define different charge to voltage relations for the first and second readout voltage potentials.

The method may comprise resetting the pixel element by draining away the electric charges from the charge accumulation region. Such resetting may set the pixel element in a reference state, e.g. a zero reference level, for determining from the first electrical signal and/or the second electrical signal the amount of radiation incident on the pixel element. The method 100 according to embodiments of the present invention may further comprise determining a first reference signal for characterizing the absence of the electrical charges generated by radiation incident on the pixel element while applying the first voltage to the electrode. The method 100 according to embodiments of the present invention may also comprise determining a second reference signal for characterizing the absence of the electrical charges generated by radiation incident on the pixel element while applying the second voltage to the electrode. The first electrical signal and the first reference signal may be combined, e.g. subtracted, to obtain a characterization of the incident radiation, e.g. a radiation intensity value, e.g. a light intensity value, in a first sensitivity range. The second electrical signal and the second reference signal may be combined, e.g. subtracted, to obtain a characterization of the incident radiation, e.g. a radiation intensity value, e.g. a light intensity value, in a second sensitivity range, e.g. a second sensitivity range which corresponds to a smaller dynamic range than the first sensitivity range, or the second sensitivity range may correspond to a higher gain factor than the first sensitivity range. Thus, a CDS technique may be applied to obtain noise corrected values. It may be advantageous to obtain the second reference signal, but not the first reference signal, as the second sensitivity range, corresponding to the highest gain, may be more noise-sensitive than the first sensitivity range.

Figure 15:
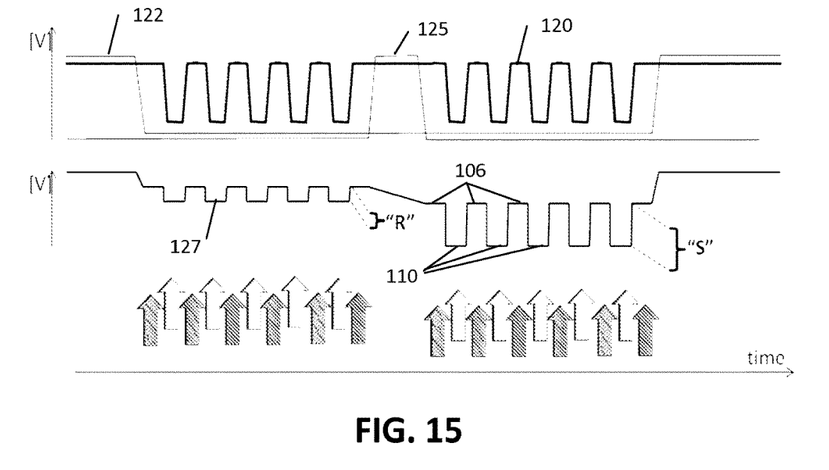
FIG. 15 illustrates an oversampling mode of operation according to embodiments of the present invention.

Referring to FIG. 15, an oversampling mode of operation according to embodiments of the present invention is illustrated. Here, the steps of applying the first voltage 104 and the second voltage 108 are repeated over a plurality of cycles, as illustrated by the temporal plot of the voltage 120 applied to the electrode. In each cycle, the step of obtaining the first 106, respectively the second 108, electrical signal "S" may also be repeated. Thus, averaging may be applied to the first and second electrical signal. Furthermore, the same may apply to the determining 127 of the first and second reference signal "R" after resetting 122 the pixel element. The exposure of the pixel element to incident radiation, and the resulting generation of the electric charges, is shown schematically by the photocurrent peak 125. This mode of operation may reduce noise on the measurements by oversampling and averaging the values. This technique may be considered similar to the charge injection device (CID) mode of operation with non-destructive readout as known in CCD technology.

Furthermore, a method according to embodiments of the present invention may comprise applying at least one further voltage to the electrode to reduce said inversion region yet further, for example applying a third voltage which is yet smaller than the second voltage, such that the electric charges are yet further concentrated into the charge accumulation region, and obtaining a third electrical signal representative of the amount of electric charges, e.g. a third readout voltage potential over the charge accumulation region.

In a method according to embodiments of the present invention, applying the first voltage to the electrode to form an inversion region in the semiconductor substrate may comprise applying a first plurality of voltages to a plurality of electrodes to form a plurality of interconnected inversion regions in the semiconductor substrate that connect to the charge accumulation region such that the electric charges are distributed over the charge accumulation region and the interconnected inversion regions. For example, a connected basin for charge storage may be formed by the charge accumulation region and the inversion regions formed by a plurality of active electrodes.

Furthermore, applying a second voltage to the electrode to reduce the inversion region may comprise applying a second plurality of voltages to the plurality of electrodes to reduce this interconnected inversion regions, e.g. to reduce the total volume and/or capacitance of the interconnected inversion regions.

The invention claimed is:

1. A method for reading out a pixel element, the method comprising:
   storing electric charges generated in response to radiation incident on the pixel element in a charge accumulation region in a semiconductor substrate;
   applying a first voltage to an electrode to form an inversion region in the semiconductor substrate that connects to the charge accumulation region such that the electric charges are distributed over the charge accumulation region and the inversion region;
   obtaining a first electrical signal representative of the amount of electric charges;
   applying a second voltage to the electrode to reduce said inversion region; and
   obtaining a second electrical signal representative of the amount of electric charges,
   wherein applying the second voltage comprises applying a second voltage which is smaller than the first voltage, such that at least a portion of the electric charges is pushed back into the charge accumulation region.

2. The method according to claim 1, wherein storing the electric charges in the charge accumulation region comprises transferring the charges from a radiation-sensitive element to the charge accumulation region.

3. The method according to claim 1, wherein storing the electric charges in the charge accumulation region comprises accumulating the electric charges in a charge accumulation region of the radiation-sensitive element.

4. The method according to claim 1, wherein applying the first voltage comprises applying a voltage sufficient for forming an inversion region which has a charge storage capacity at least equal to the charge storage capacity of the charge accumulation region.

5. The method according to claim 1, wherein obtaining the first electrical signal comprises obtaining a first readout voltage potential over the charge accumulation region and obtaining the second electrical signal comprises obtaining a second readout voltage potential over the charge accumulation region.

6. The method according to claim 1, further comprising resetting the pixel element by draining away the electric charges from the charge accumulation region.

7. The method according to claim 6, also comprising determining a first reference signal for characterizing the absence of the electrical charges generated by radiation incident on the pixel element while applying the first voltage to the electrode.

8. The method according to claim 6, also comprising determining a second reference signal for characterizing the absence of the electrical charges generated by radiation incident on the pixel element while applying the second voltage to the electrode.

9. The method according to claim 1, further comprising applying at least one further voltage to the electrode to reduce said inversion region yet further, and obtaining a third electrical signal representative of the amount of electric charges.

10. The method according to claim 9, wherein applying a second voltage to the electrode to reduce said inversion region, comprises applying a second plurality of voltages to a plurality of electrodes to reduce said interconnected inversion regions.

11. The method according to claim 1, wherein applying a first voltage to an electrode to form an inversion region in the semiconductor substrate comprises applying a first plurality of voltages to a plurality of electrodes to form a plurality of interconnected inversion regions in the semiconductor substrate that connect to the charge accumulation region such that the electric charges are distributed over the charge accumulation region and the interconnected inversion regions.

* * * * *